United States Patent [19]
Turner et al.

[11] Patent Number: 5,603,619
[45] Date of Patent: Feb. 18, 1997

[54] SCALABLE TEST INTERFACE PORT

[75] Inventors: Leonard O. Turner, Beaverton; Gerald A. Budelman; Mark B. Trobough, both of Aloha, all of Oreg.

[73] Assignee: Intel Corporation, Santa Clara, Calif.

[21] Appl. No.: 504,842

[22] Filed: Jul. 20, 1995

[51] Int. Cl.$^6$ .................................................. H01R 9/09
[52] U.S. Cl. ................................ 439/69; 439/66; 439/67
[58] Field of Search .................................. 439/66, 67, 69, 439/70, 71, 74, 75, 91, 591

[56] References Cited

U.S. PATENT DOCUMENTS 5,226,823  7/1993  Johnson ............................ 439/69 X
5,273,439  12/1993  Szeplip et al. ......................... 439/66
5,309,324  5/1994  Hernandez et al. ................. 439/66 X
5,360,347  11/1994  Irlbeck et al. ........................ 439/66

*Primary Examiner*—Khiem Nguyen
*Attorney, Agent, or Firm*—Blakely, Sokoloff, Taylor & Zafman

[57] ABSTRACT

An apparatus for electrically connecting electrical contact pads on a first circuit board to electrical contact pads on a second circuit board is disclosed. Conductive bumps coupled to signal wires on a support element mate with the electrical contact pads on the first and second circuit boards. The mating provides an electrical connection allowing signals to be transmitted between the circuit boards. Alignment holes and alignment circuitry provide a means for verifying that the proper conductive bumps are mating with the proper electrical contact pads.

20 Claims, 8 Drawing Sheets

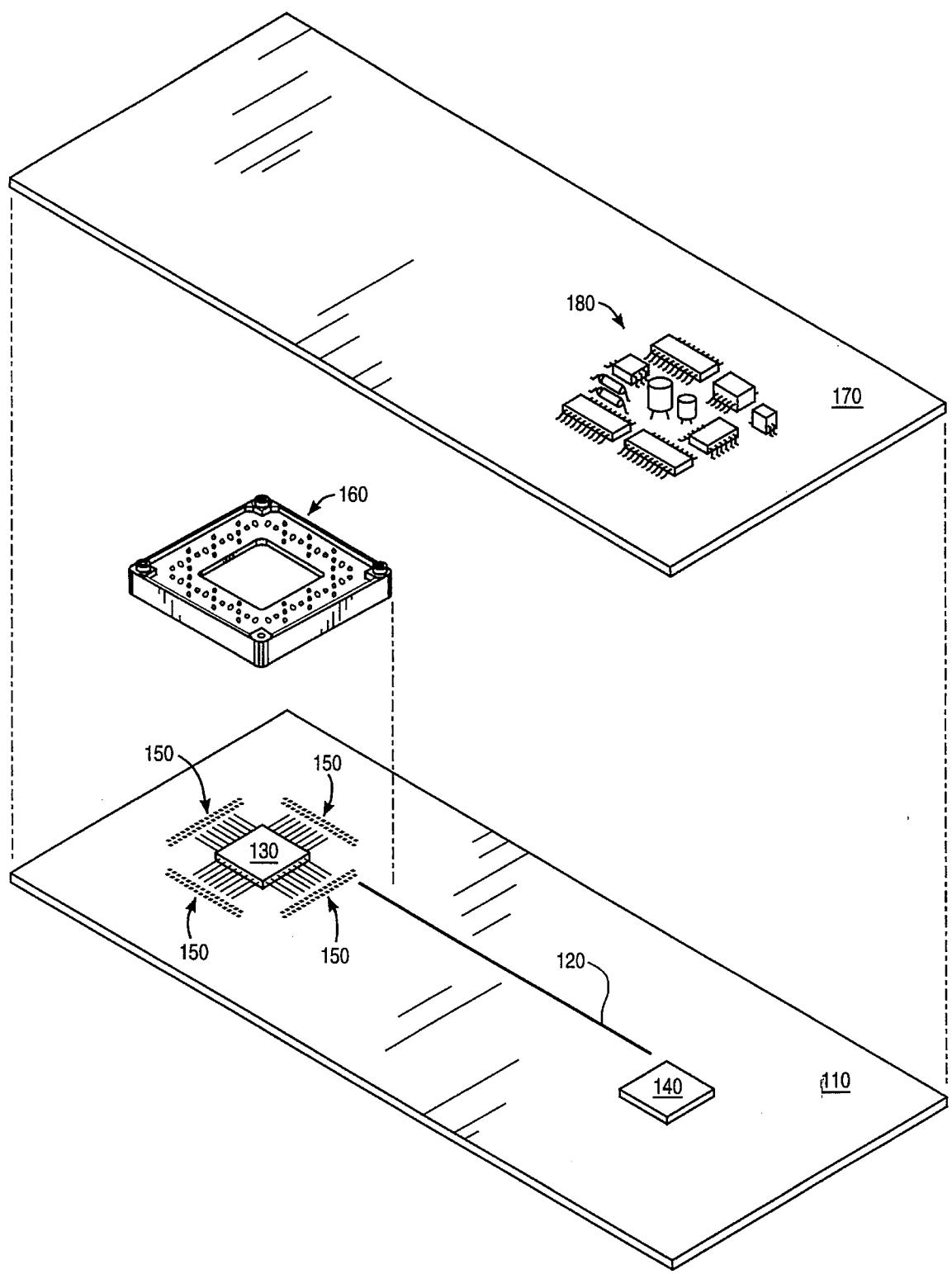
FIG_1

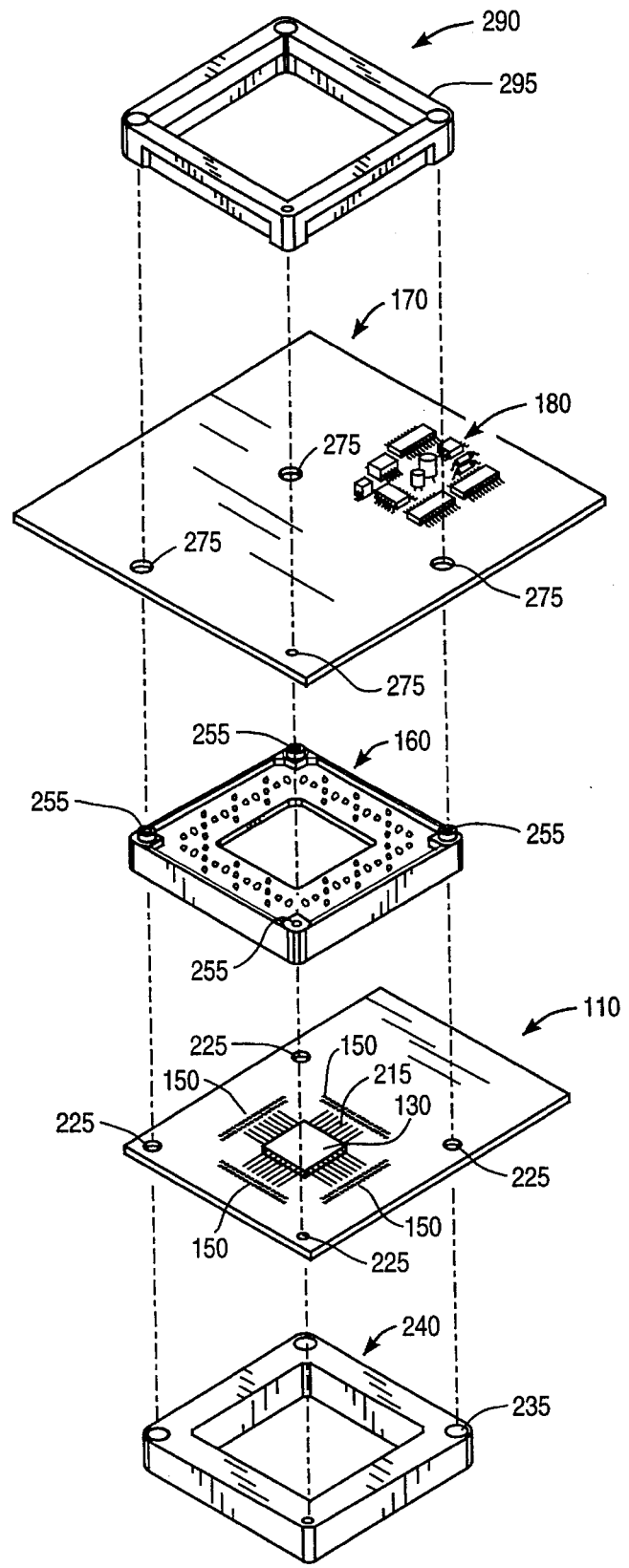
FIG_2

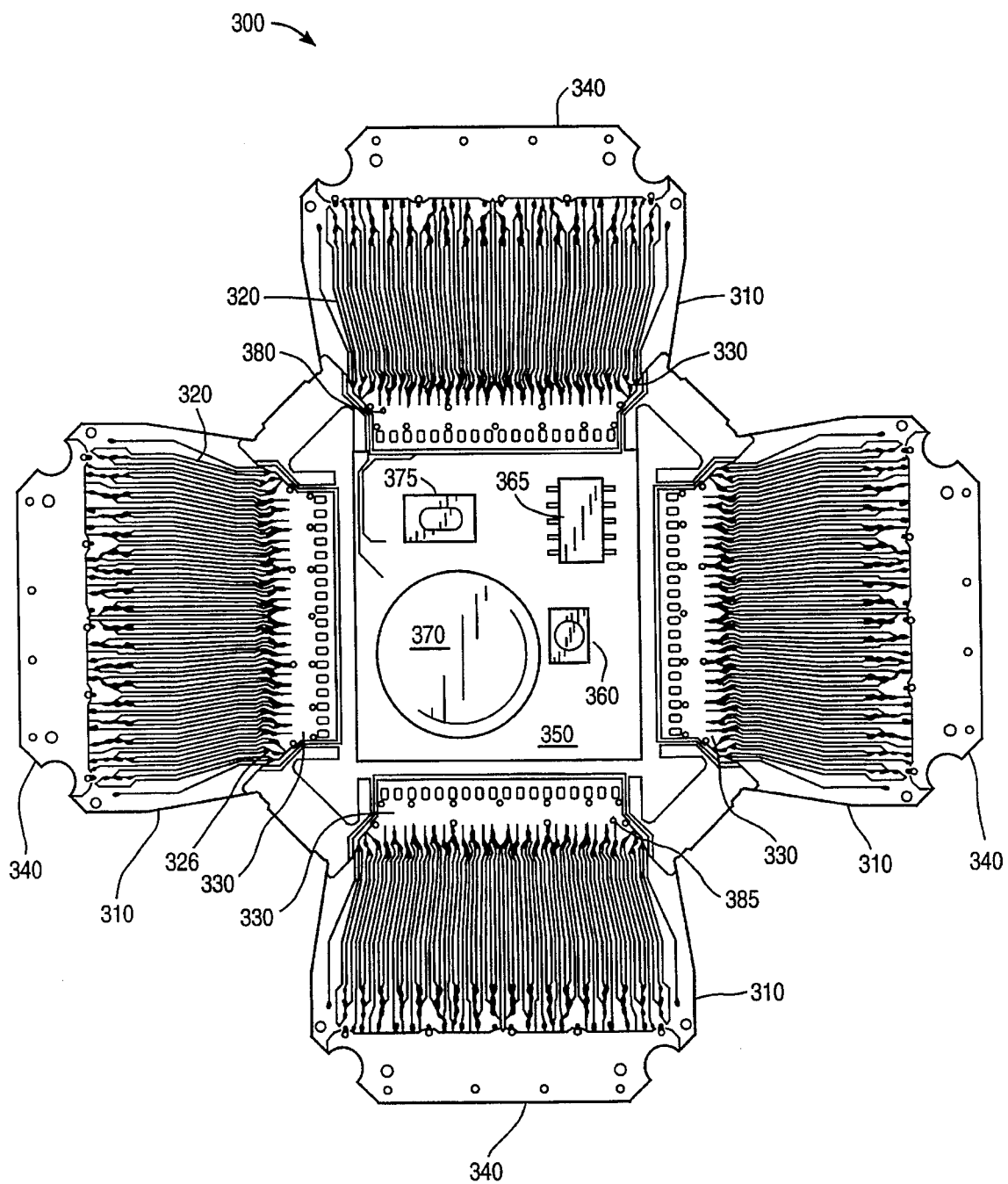
FIG_3

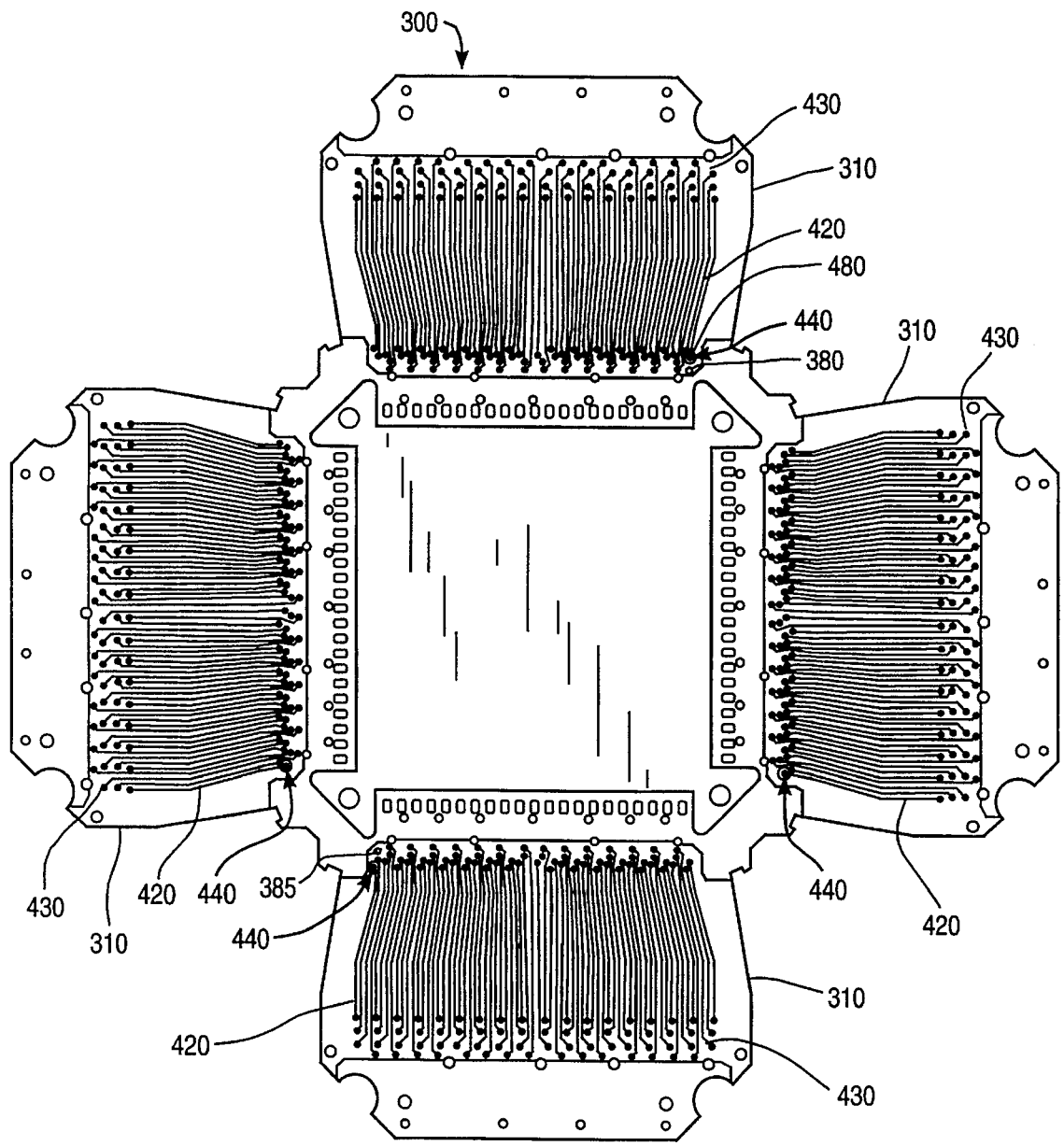
FIG_4

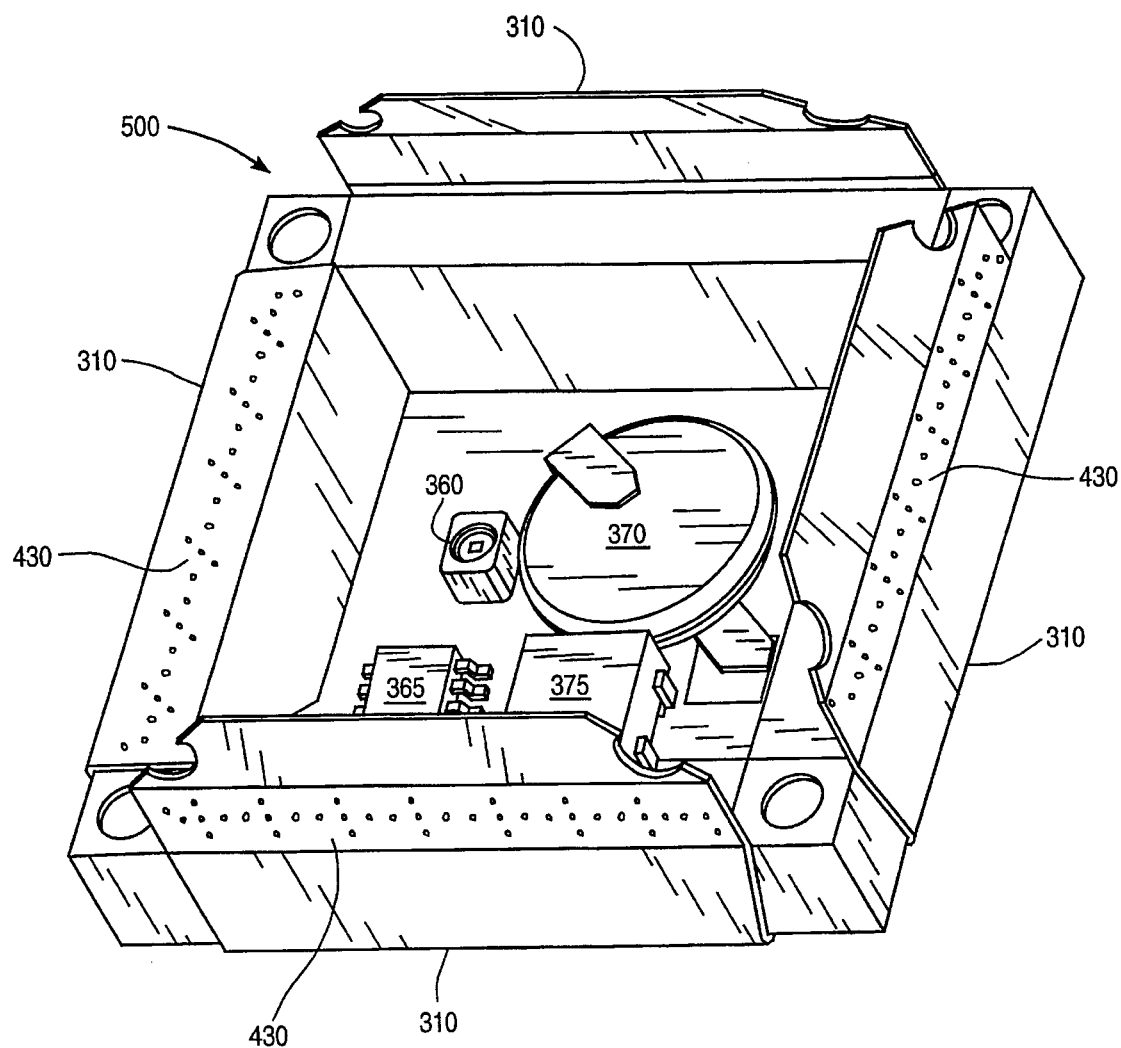
FIG_5

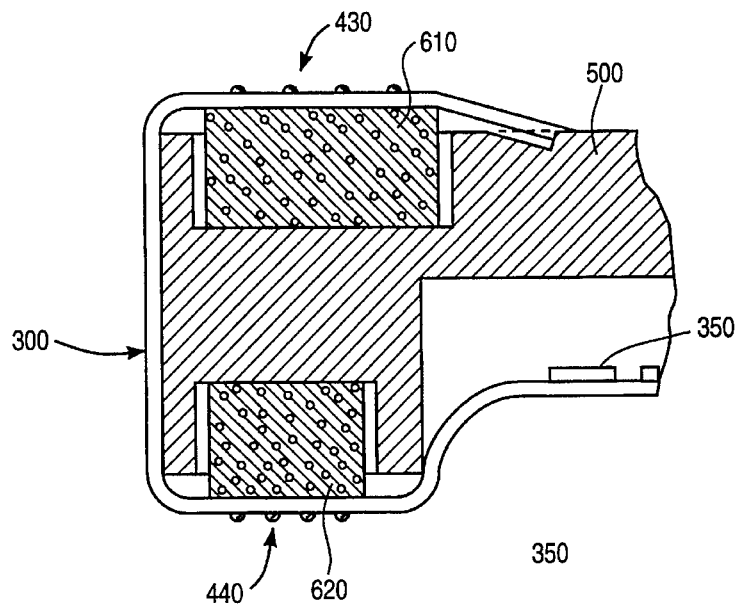
FIG_6
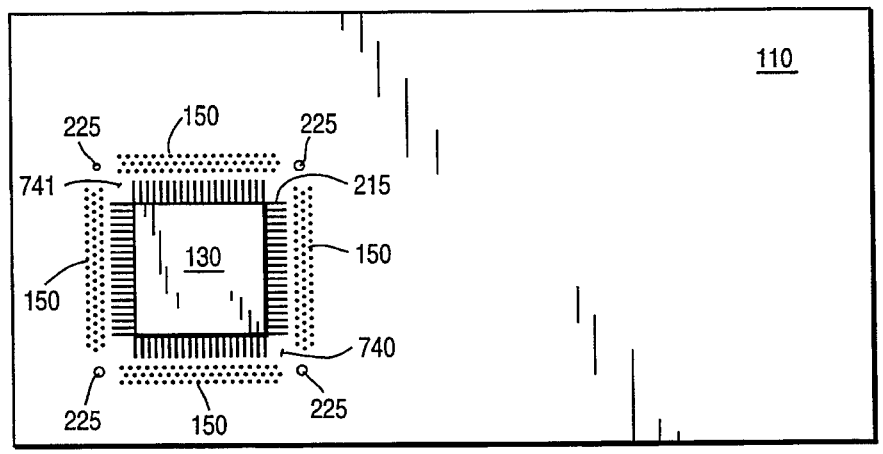
FIG_7
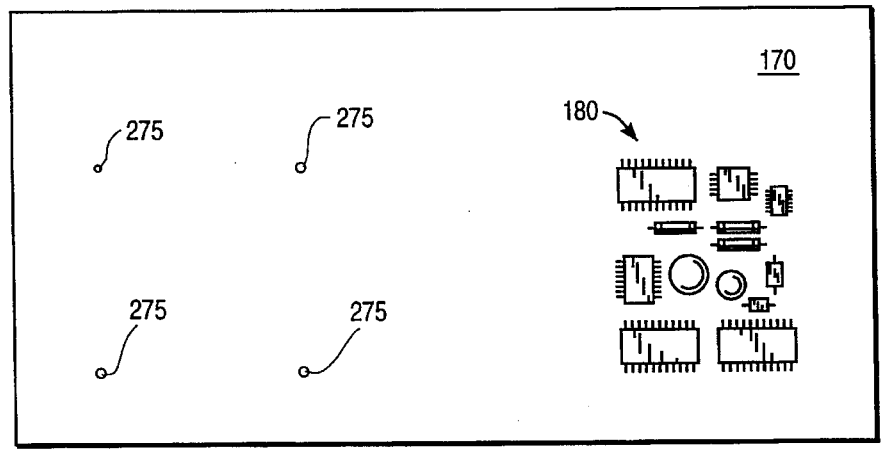
FIG_8

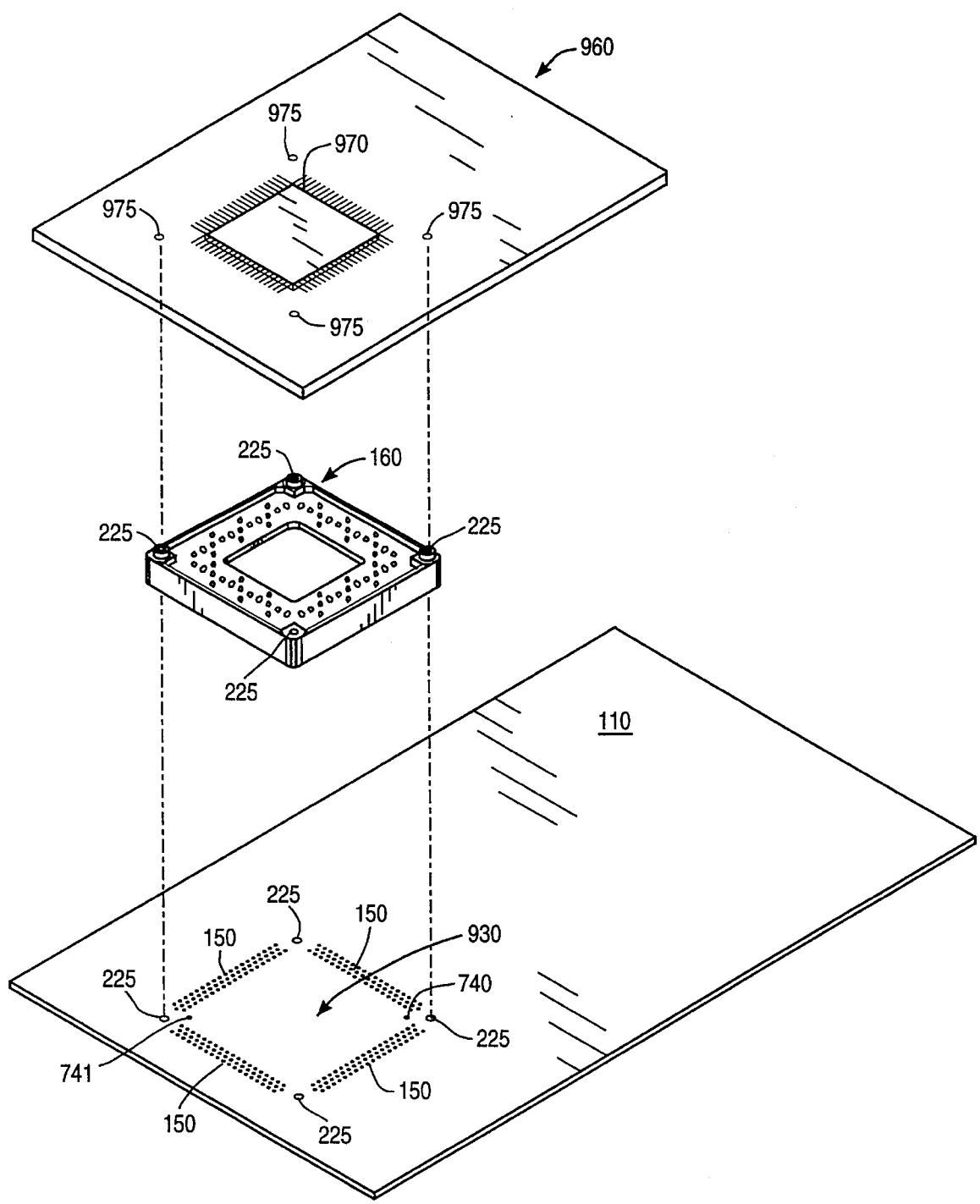
FIG_9

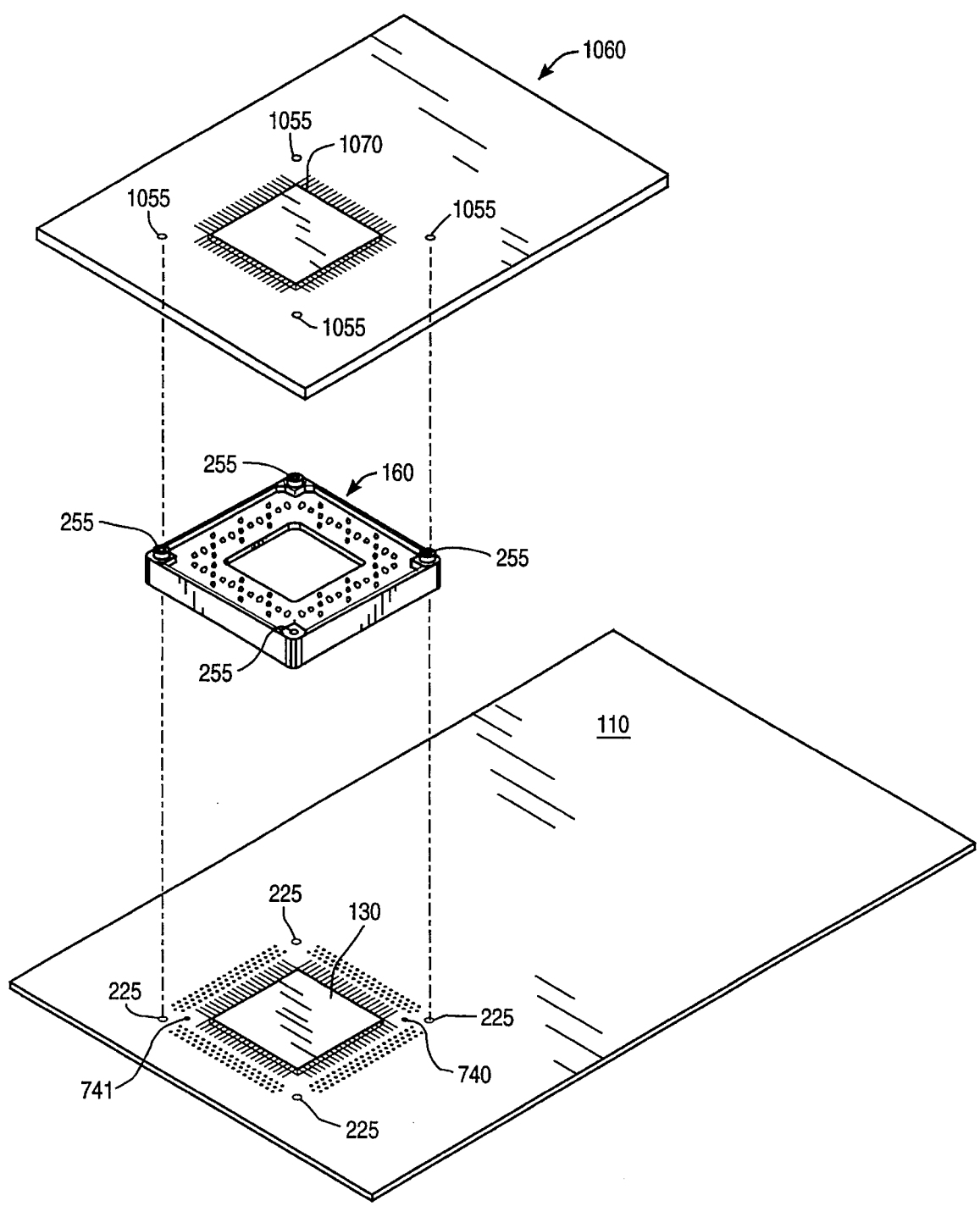
FIG_10

SCALABLE TEST INTERFACE PORT

FIELD OF THE INVENTION

The present invention relates to the field of electrical connectors. More specifically, the present invention relates to an apparatus for connecting auxiliary equipment to circuitry using microprocessors, integrated circuits or other surface-mount components.

BACKGROUND OF THE INVENTION

When debugging and repairing circuit boards containing surface-mount components, a connection between the circuit board and auxiliary test equipment is needed to transmit signals between the circuit board and the test equipment. In the past, various interconnect methods were attempted to establish this connection. Such methods included using connector devices which pressed down conductive elements over the leads of the surface-mount component, using devices which soldered conductive elements to the leads of the surface-mount component or to the lands on the circuit board, and using devices which mounted outside the surface-mount component's footprint and provided a pin-and-socket interface.

The devices used in the prior art for establishing interconnection between auxiliary equipment and circuitry using surface-mount components had several drawbacks. First, devices which pressed down over the leads of the surface-mount component typically carried the risk of damaging the component's leads. Second, devices which soldered to the leads of the surface-mount component or to the lands on the user's board had the drawback of slow installation and posed the danger of creating shorts between pins at finer pitches. Lastly, devices which mounted outside the surface-mount component's footprint and provided pin-and-socket interface tied up valuable internal wiring planes as well as necessitated relatively wide spacing between adjacent connections. This limits the density of connections that can be made on the surface of the board.

In addition to these drawbacks, the methods of interconnection in the prior art also had problems when implemented for connecting test equipment to circuit boards containing finer-pitch surface-mount packages. Advances in microprocessing and packaging technology have led to smaller surface-mounted microprocessor components utilizing a greater number of leads with more compact spacing. Today's microprocessor components can contain several hundred leads that are spaced individually less than 0.010 inches apart.

The devices used in the past for connecting test equipment to circuit boards containing coarser-pitch microprocessor components were ineffective for connecting test equipment to circuit boards containing fine-pitch, surface mounted microprocessors. Devices which pressed down over the leads of the microprocessor component had problems with the shorter, smaller, and more closely spaced leads. Solder-on devices were subject to poor solder joints, human error, and the possibility of damaging the microprocessor. In addition, the possibility of creating shorts between leads became more likely. Devices which mount outside the component footprint for the newer, finer-pitch microprocessors still required more space on the circuit board than the designer could afford.

Thus, an electrical connector which is able to establish interconnection between circuitry using surface-mount components on a first circuit board and auxiliary circuitry on a second circuit board without damaging the component leads, creating shorts between the pins of the components, and without occupying an excessive amount of space on the circuit board is needed. This connector must be able to interface with surface-mount component connections on a circuit board where the component leads are spaced less than 0.010 inches apart. This connector must also be able to be implemented mechanically by a user without requiring much effort.

The present invention overcomes the drawbacks of the prior art by providing an electrical connector which utilizes signal wiring coupled to conductive bumps of fine geometry and reliable alignment techniques. Since electrical contact is established with the electrical connector through electrical contact pads on both the first and second circuit boards, the present invention allows interconnection between circuitry on the circuit boards without requiring the presence of a microprocessor on the first circuit board. This allows the electrical connector to be used with logic analyzer and in-circuit emulator test equipment.

Connections made independent of accessing the leads of the microprocessor allows a single implementation of the present invention to provide interconnection with different microprocessor implementations and packages types. For example, the electrical connector can be implemented with ball grid array (BGA) packages, tape carrier packages (TCP), and high density QFP (HDQFP) packages. The techniques of interconnection implemented by the present invention is also scalable. Additional contact bumps and signal lines can be added to the electrical connector.

SUMMARY OF THE INVENTION

The present invention is an improved electrical connector for providing interconnection between circuitry using surface-mount components on a first circuit board and auxiliary circuitry on a second circuit board. The electrical connector connects electrical contact pads coupled to the circuitry on the first circuit board with electrical contact pads coupled to the auxiliary circuitry on the second circuit board.

In one embodiment of the invention, a support element is used for providing structural framework for the electrical connector. Signal traces inside a flexible circuit coupled to the support element are used for transmitting signals from the electrical contact pads on the first circuit board to the electrical contact pads on the second circuit board. Conductive bumps coupled to the signal traces are arranged on the flexible circuit for providing electrical contact between the signal traces and the electrical contact pads on the first and second circuit boards. Electrical contact between the signal traces and the electrical contact pads on the first and second circuit board is achieved by mating the conductive bumps on the signal traces with the electrical contact pads on the circuit boards. In order for the conductive bumps to mate with the electrical contact pads, the electrical contact pads on the first and second circuit boards must be properly aligned with the conductive bumps on the flexible circuit.

In accordance with the invention, a plurality of alignment posts in the support element are used for aligning the conductive bumps on the support element with the electrical contact pads on the second circuit board. Alignment is achieved by aligning specifically located and sized posts on the support element with specifically located and sized holes on the second circuit board. The geometry of the electrical contact pads, the holes on the second circuit board, the geometry of the conductive bumps, and the alignment posts on the support element allow electrical connections to be made between the conductive bumps on the flexible circuit and electrical contact pads on the second circuit board. Electrical connection is achieved through simple mechanical alignment of the posts on the support element with the holes on the second circuit board.

Coarse alignment between the electrical connector and the first circuit is achieved by aligning specifically located and sized posts on the support element with specifically located and sized holes on the first circuit board. The geometry of the electrical contact pads, the holes on the first circuit board, the geometry of the conductive bumps, and the alignment posts on the support element allow coarse alignment between the conductive bumps on the flexible circuit and electrical contact pads on the first circuit board.

Fine alignment is achieved by using alignment circuitry on the electrical connector. Alignment circuitry coupled to the support element provides verification that the conductive bumps on the support component are aligned with the electrical contact pads of the first circuit board. This is a necessary and key feature for aligning to the first board. The alignment circuitry includes a visual alignment indicator and alignment test mechanism.

BRIEF DESCRIPTION OF THE DRAWINGS

The present invention will be understood more fully from the detailed description given below and from the accompanying drawings of the preferred embodiment of the invention. The description and drawings are not meant to limit the invention to the specific embodiment. They are provided for explanation and understanding of the present invention.

FIG. 1 illustrates the motherboard of a computer system configured with the electrical connector of the present invention and a second auxiliary board configured with the electrical connector.

FIG. 2 is an exploded perspective view of one embodiment of the present invention.

FIG. 3 illustrates the ground side of the flexible circuit assembly employed in one embodiment of the present invention.

FIG. 4 illustrates the signal side of the flexible circuit assembly employed in one embodiment of the present invention.

FIG. 5 is an isometric view of one embodiment of the flexible circuit assembly on the support element.

FIG. 6 is a cross-sectional view of one embodiment of the flexible circuit assembly, elastomeric pads, and the support element.

FIG. 7 illustrates one embodiment of a motherboard implementing the present invention.

FIG. 8 illustrates one embodiment of an auxiliary test board implementing the present invention.

FIG. 9 is an exploded view of one embodiment of the present invention used as a primary attachment mechanism for a surface-mounted microprocessor.

FIG. 10 is an exploded view of one embodiment of the present invention used as an upgrade mechanism for surface-mounted microprocessors.

DETAILED DESCRIPTION

An apparatus for connecting auxiliary equipment to circuitry using microprocessors or other surface-mount components is disclosed. In the following description, numerous specific details including component size and composition are set forth in order to provide a thorough understanding of the preferred embodiment of the present invention. It will be obvious, however, to one skilled in the art that the present invention may be practiced without these specific details. In other instances, well-known circuitry, structures, and methods have not been shown in detail in order to avoid unnecessarily obscuring the present invention.

Electrical connectors can be implemented to perform any number of functions. For example, an electrical connector can be used in a computer system to connect auxiliary test circuitry to a circuit board containing the microprocessor of the system for testing the circuit board. FIG. 1 illustrates a motherboard of a computer system configured with the electrical connector of the present invention. The computer system comprises a bus 120 for transferring information. A microprocessor 130 is used for processing information. Main memory 140 is comprised of random access memory (RAM) or some other dynamic storage device which is used in storing information and instructions to be executed by the microprocessor 130. An array of electrical contact pads 150 surround the periphery of the microprocessor 130. The electrical contact pads 150 are connected to the microprocessor leads through connections within the circuit board 110.

As an example, electrical connector 160 interfaces with the electrical contact pads 150 on circuit board 110 and similar electrical contact pads on the bottom side of auxiliary circuit board 170. The electrical connector 160 allows the circuitry on the motherboard 110 and the circuitry 180 on auxiliary circuit board 170 to communicate with each other.

FIG. 2 illustrates an exploded perspective of one embodiment of the present invention. First circuit board 110 is a standard motherboard in a computer system where the system's microprocessor 130 is connected. The microprocessor 130 is packaged in a tape-carrier package with leads 215 on a 0.010 inch pitch. An array of electrical contact pads 150 surrounds the periphery of the microprocessor 130. The electrical contact pads 150 are electrically connected to the first circuit board's connection with the microprocessor 130. A set of four holes 225 are located on the first circuit board 110 for coarse aligning and fastening of the electrical connector 160 to the first circuit board 110.

Electrical connector 160 comprises a flexible circuit assembly wrapped around a support element. Signal wires in the flexible circuit assembly run from the side of the electrical connector facing the second circuit board 170 to the side facing the first circuit board 110. Conductive bumps on the flexible circuit mate with the array of electrical contact pads 150 on the first circuit board 110 to establish electrical contact between the signal wire and the electrical contact pads on the first circuit board 110. Mating is achieved by coarsely aligning a set of alignment posts 255 on the electrical connector 160 with a set of holes 225 on the first circuit board 110 to ensure proper orientation of the connector. The diameter size of the holes in each set are different. Alignment circuitry on the electrical connector 160 allows fine alignment of the electrical contact pads on the first circuit board 110 and the conductive bumps on the flexible circuit. The alignment circuitry provides verification that alignment exists through a visual alignment indicator. This insures that the electrical connector 160 is properly attached to the first circuit board 110 such that the appropriate electrical contact pads 150 on the first circuit board 110 mate with the appropriate conductive bumps on the electrical connector 160.

Second circuit board 170 contains test circuitry 180 for testing first circuit board 110. Electrical contact pads on the bottom of the second circuit board 170 are in electrical contact with the test circuitry 180 on the board. Conductive bumps on the signal traces of the electrical connector's flexible circuit mate with the array of electrical contact pads on the bottom of second circuit board to form electrical connections between the test circuitry 180 on the second circuit board and the signal traces on the electrical connector 160. Mating is achieved by aligning a set of alignment posts 255 of differing sizes on the support element with a set of posts of differing sizes 275 on the second circuit board. The electrical connector 160 may be fastened to the second circuit board 170 by inserting screws though the holes 275 of the second circuit board 170 and the alignment holes 255 on the electrical connector 160.

Support elements 240 and 290 are fastened to the first and second circuit boards 110 and 170 to prevent the boards from bending or bowing. Support elements 240 and 290 are optional if first and second circuit boards 110 and 170 are of a thickness which do not incur bending or bowing problems. Support elements 240 and 290 are fastened to first and second circuit boards 110 and 170 by inserting a set of screws through holes 235, 225, 255, 275 and 295.

The electrical connector 160 achieves interconnection without pressing down over the leads 215 of microprocessor 130, soldering to the leads of microprocessor 130, or soldering to the lands of the first circuit board 110. Interconnection is achieved by connecting the contact pads 150 on the first circuit board 110 with the contact pads on the second circuit board 170 with electrical connector 160. The present invention is an improvement over the prior art because it will not damage the leads 215 of the microprocessor 130 nor will it create shorts between the leads of the microprocessor 130. The present invention is also able to provide interconnection for circuit boards containing finer-pitch surface mount components, unlike prior art devices in the past.

FIG. 3 illustrates the ground side of the flexible circuit assembly implemented in one embodiment of the present invention. The ground side of the flexible circuit assembly is the side of the flexible circuit assembly which contains the ground traces. Flexible circuit assembly 300 comprises flexible circuit components 310 and alignment circuit 350. The flexible circuit components 310 are located on the outer regions of the flexible circuit assembly 300. The flexible circuit components 310 comprise a network of signal traces for transmitting signals and a network of ground traces 320 for reducing cross-talk in the signal traces. Both the signal traces and ground traces 320 are made of conductive material. In one embodiment of the present invention, the signal traces and ground traces are made of copper.

The flexible circuit components 310 are constructed for controlled impedance, low cross-talk, and low capacitance. The flexible circuit components 310 have a layer of polyimide film on both its top surface and bottom surface for protective covering. A first layer of conductive traces serves as the ground wires for the circuit. A second layer of conductive traces, beneath the first layer, serves as the signal carrying wires for the circuit. A layer of polyimide film between the two layers of conductive traces serves as an insulator. Controlled impedance, low cross-talk, and low capacitance is achieved by having the ground traces interspersed between the signal carrying traces. This allows the ground traces 320 to minimize cross-talk by reducing the lines of flux produced by the signal carrying traces while maintaining the smallest amount capacitance by maximizing the distance between the signal to ground. The geometry of the signal traces, ground traces, and film materials may be varied to control the electrical characteristics of the electrical connector. Plates 330 and 340 provide a connection to ground for the ground wires 320. Plates 330 and 340 also provide structural support for flexible circuit assembly 300. Plates 330 and 340 can be constructed with any variety of conductive materials. In one embodiment of the present invention, plates 330 and 340 are constructed from copper.

Alignment circuit 350 is located at the center region of the flexible circuit assembly 300. LED 360, timing circuit 365, battery 370, reset switch 375 and alignment bumps 380 and 385 are components of the alignment circuitry on the flexible circuit assembly 300. The alignment bumps 380 and 385 are positioned at opposite corners of the flexible circuit assembly 300 so that they align with two alignment pads on the first circuit board when the conductive bumps mate with the electrical contact pads on the first circuit board. Once alignment bumps 380 and 385 are aligned with the two alignment pads on the first circuit board an electrical connection is completed and LED 360 is lit. After a predetermined amount of time, timer circuit 365 turns off the LED 360 to save power. Reset switch 375 is used to determine whether the battery 370 still has power and whether there is still alignment after the electrical connector is installed. The alignment circuit 350 allows the electrical connector to be placed mechanically on a first circuit board and provides verification that the proper contact pads are mating with the proper conductive bumps.

FIG. 4 illustrates the signal side of the flexible circuit assembly implemented in one embodiment of the present invention. The signal side of the flexible circuit assembly contains the signal carrying traces 420. The signal side of the flexible circuit assembly is the side opposite that of the ground side. A network of signal traces 420 stretch from one end of the flexible circuit components 310 to the other.

Signal traces 420 have conductive bumps 430 and 440 coupled to their ends. The conductive bumps 430 and 440 extend out from the signal traces through holes in the polyimide film cover layer. The polyimide film cover layer is a non-conductive plastic material which protects the copper traces from casual damage and shorting. The conductive bumps 430 and 440 in this embodiment of the invention are 0.005 inches high from the surface of the copper signal trace. The conductive bumps 430 and 440 has a diameter of 0.010 inches at the base of the bump and 0.0085 inches on the apex of the bump. The conductive bumps 430 and 440 may be either cone shaped or straight-sided and are may be coated with either gold, palladium or other types of conductive metals. Conductive bumps 440 are located near the center of the flexible circuit assembly and mate with electrical contact pads on the first circuit board containing computer system circuitry. Conductive bumps 430 are located at the outer edges of the flexible circuit components and mate with electrical contact pads on a second circuit board containing auxiliary circuitry. Alignment bumps 480 and 485 are located on opposite corners of the signal side of the flexible circuit assembly. In one embodiment of the present invention, conductive bumps 430 and alignment bumps 480 and 485 are critical alignment elements which are fabricated on a single plane using a photolithography process. This allows the bumps to be constructed in a precise relationship to one another.

FIG. 5 illustrates an isometric view of one embodiment of the electrical connector. Support element 500 is a square ring of rigid material which provides the structural support for the electrical connector. The support element 500 in the present embodiment is made of annodized aluminum. The flexible circuit assembly is wrapped around the support element. The flexible circuit components 310 are folded around the edges of the support element 500. FIG. 5 shows three flexible circuit components partially folded and one flexible circuit component fully folded. Conductive bumps 430 are arranged on the outer region of the flexible circuit component 310 and sit on top of the support element 500. The conductive bumps 430 on top of the support element 500 mate with electrical contact pads on the second circuit board containing test circuitry. Alignment circuitry components including LED 360, timing circuit 365, reset switch 375, and battery 370 are located inside the enclosed region of the support element 500.

FIG. 6 shows a partial cross-section view of one embodiment of the electrical connector. Elastomeric pads 610 and 620 are positioned behind the conductive bumps 430 and 440. The elastomeric pads 610 and 620 in the present embodiment are made of silicone rubber. The elastomeric pads 610 and 620 apply pressure to the conductive bumps 430 and 440 so that the bumps can maintain contact with the electrical contact pads of the first and second circuit boards even when the electrical contact pads are at different heights. Conductive bumps 440 mate with electrical contact pads on a first circuit board containing computer system circuitry. Conductive bumps 430 mate with electrical contact pads on a second circuit board containing auxiliary circuitry. Apex of adjacent bumps are coplanar within 0.0005 inches. Elastomeric pads 610 and 620 are positioned between the flexible circuit assembly 300 and the support element 500. Also illustrated in FIG. 6 is the alignment circuitry 350.

FIG. 7 illustrates one embodiment of a motherboard implementing the present invention. The motherboard 110 is a standard circuit board in a computer system containing the system's microprocessor 130. The microprocessor 130 is packaged in a TCP with leads 215 on a 0.010 inch pitch. An array of electrical contact pads 150 surrounds the periphery of the microprocessor 130. Electrical contact pads 150 are electrically connected to the first circuit board's connection with the microprocessor 130. The electrical contact pads 150 on the first circuit board 110 can be solder-plated or treated by any other equivalent means to provide a highly conductive non-corrosive surface. The pads do not need to be plated with gold or other precious metals, though these platings would work if used. The first circuit board 110 does not need to be perfectly flat to insure good connections between the electrical contact pads 150 and the conductive bumps on the electrical connector. Warpage in the first circuit board can be corrected by the pressure exerted by the support element in the electrical connector and an additional stiffener fastened on the side of the first circuit board opposite the electrical connector. The electrical contact pads 150 on the present embodiment of the first circuit board have a diameter of 0.012 inches. The pads are coplanar within 0.0002 inches. The solder mask thickness on the circuit board is under 0.002 inches above the traces on the board.

The electrical contact pads 150 provide a electrical connection to the first circuit board's connection with the microprocessor. This allows the electrical connector to be electrically connected to the first circuit board whether or not a microprocessor is present on the board. This provides an advantage over the prior art interconnect method of press down devices which require a microprocessor component on the board to work. With the present invention, circuit boards may be tested with or without a microprocessor component on it.

The arrangement of the electrical contact pads 150 is economically spaced to conserve the area around the microprocessor. In order to provide economy of space while guaranteeing good connections between the electrical contact pads and conductive bumps, the electrical connector utilizes an alignment sensor. The sensor makes use of two alignment pads 740 and 741 on the first circuit board 700. Alignment pads 740 and 741 are pads half the diameter of the other electrical contact pads 150 surrounding the periphery of the microprocessor and are located at opposite ends of the contact pad area. The two alignment pads are electrically connected with each other so that when corresponding alignment bumps on the electrical connector make contact with the alignment pads, the alignment circuitry on the electrical connector is closed and a battery-powered LED on the electrical connector lights, indicating that the alignment pads and bumps are in contact. Because the alignment pads are smaller than the other electrical contact pads and are located at opposite ends of the pad farm, the other electrical contact pads and conductive bumps are making contact concurrently with the alignment bumps and alignment pads.

After a predetermined amount of time, a timer circuit turns off the LED to save power. A test switch operates to determine whether the battery powering the alignment circuitry has power and whether there is alignment after the electrical connector is installed. In one embodiment of the present invention, the battery-powered LED is activated when the test switch is depressed to show that the alignment circuitry is powered. The indicator remains activated for a period of time after the test switch is released to show that the electrical connector is properly aligned with the first and second circuit boards.

A set of holes 225 are located on the first circuit board 110 for aligning and fastening the electrical connector to the board. The same set of holes 225 may be used for fastening an additional stiffener to the board for extra support.

FIG. 8 illustrates one embodiment of an auxiliary test board implementing the present invention. Auxiliary test board 170 contains test circuitry 180 for testing the motherboard. Test circuitry 180 is electrically coupled to electrical contact pads located on the side of the auxiliary test board 170 opposite that of the test circuitry 180. The electrical contact pads mate with the conductive bumps on the electrical connector and provide an electrical connection between the test circuitry 180 and the circuitry on the motherboard. A set of four holes 275 on the auxiliary test board 170 are used for aligning and fastening the electrical connector to the board. The same set of holes 275 may be used for fastening an additional stiffener to the board for extra support.

In the current embodiment of the electrical connector, alignment bumps are provided for use by the auxiliary test board. In another implementation of the present invention, alignment pads can be placed on the auxiliary test board and additional alignment circuitry can be constructed on the auxiliary test board to provide verification means for checking whether the contact pads on the auxiliary board are aligned with the conductive bumps on the electrical connector and that the electrical connector is properly aligned with the contact pads on the first circuit board.

Although the present invention has been described as an interconnect solution for connecting signals between two circuit boards, the present invention can also be implemented as a primary attachment technique or an upgrade strategy for integrated circuit components such as microprocessors. FIG. 9 illustrates one embodiment in which the present invention is used as a primary attachment technique. First circuit board 110 is a motherboard for use in a computer system. First circuit board 110 has an array of contact pads 150 surrounding the area 930 where a microprocessor is normally mounted on the motherboard 910. First circuit board 110 also has a set of four holes 225 for aligning and fastening electrical connector 160. Conductive bumps on electrical connector 160 mate with contact pads on first and second circuit board 110 and 960 as previously described and illustrated in FIG. 2. However, instead of using second circuit board 960 as a test board, second circuit board 960 is used as a platform to attach a microprocessor component 970. In this implementation of the present invention, one can attach or remove the second circuit board along with its processor by simply screwing or unscrewing a set of four screws through holes 225, 255, and 975.

Similarly, the present invention can also be used as a microprocessor upgrade strategy. FIG. 10 illustrates one embodiment in which the present invention is used as an upgrade strategy for replacing microprocessors. When one wishes to replace processor 130 on motherboard 110 with an upgrade processor, replacement processor 1070 on second circuit board 1060 can be interfaced with the first circuit board 110 by using electrical connector 160. Upgrade processor 1070 can be connected to motherboard 110 by simply screwing four screws through holes 1055, 255, and 225.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Whereas many alterations and modifications of the present invention will be comprehended by a person skilled in the art after having read the foregoing description, it is to be understood that the particular embodiments shown and described by way of illustration are in no way intended to be limiting. Therefore, references to details of particular embodiments are not intended to limit the scope of the claims which in themselves recite only those features regarded as essential to the invention.

What is claimed is:

1. An apparatus for electrically connecting electrical contact pads on a first circuit board to electrical contact pads on a second circuit board comprising:

a support element;

a plurality of signal wires coupled to said support element;

a plurality of conductive bumps coupled to said signal wires, arranged on said support element for providing electrical contact between said signal wires and said electrical contact pads on said first circuit board and for providing electrical contact between said signal wires and said electrical contact pads on said second circuit board;

a plurality of alignment post and holes in said support element for aligning said electrical contact pads on said first circuit board and said second circuit board with said plurality of conductive bumps; and alignment circuitry coupled to said support element for indicating whether said support element is properly aligned with said first circuit board.

2. The apparatus in claim 1 where said contact pads are arranged in a first pattern and said conductive bumps are in locations that match said first pattern.

3. The apparatus in claim 1 where said plurality of alignment holes comprise a set of four holes for aligning said support element with said first circuit board and for aligning said support element with said second circuit board, wherein screws may be inserted through said alignment holes to fasten said support element to said first and second circuit boards.

4. The apparatus in claim 1 where said alignment circuitry comprises two alignment bumps positioned at opposite ends of the support element such that said alignment bumps are in contact with two alignment pads on said first circuit board when said conductive bumps on said support element are in electrical contact with said electrical contact pads on said first circuit board, where when contact is made between said alignment bumps and said alignment pads an indicator is activated.

5. An apparatus for electrically connecting electrical contact pads on a first circuit board to electrical contact pads on a second circuit board comprising:

support means for providing a structural framework for said apparatus;

transmission means coupled to said support means for sending an electrical signal from one location to another;

conduction means coupled to signal wires, arranged on said support means for providing electrical contact between said signal wires and said electrical contact pads on said first circuit board and for providing electrical contact between said signal wires and said electrical contact pads on said second circuit board, alignment means in said support means for aligning electrical contact pads on said first circuit board and said second circuit board with a plurality of conductive bumps; and indication means for indicating whether said support means is properly aligned with said first circuit board.

6. The apparatus in claim 5 where said contact pads are arranged in a first pattern and said conduction means are in locations that match said first pattern.

7. The apparatus in claim 5 where said alignment means include a set of four holes for aligning said support means with said first circuit board and for aligning said support means with said second circuit board, wherein screws may be inserted through said alignment means to fasten said support means to said first and second circuit boards.

8. The apparatus in claim 5 where said indication means comprises two alignment bumps positioned at opposite ends of said support means such that said alignment bumps are in contact with two alignment pads on said first circuit board when said conduction means on said support means are in electrical contact with said electrical contact pads on said first circuit board, where when contact is made between said alignment bumps and said alignment pads an indicator is activated.

9. A computer system comprising:

a microprocessor for processing digital data on a motherboard;

a memory for storing digital data;

a bus for coupling said microprocessor to said memory;

an apparatus for electrically connecting electrical contact pads of said motherboard to electrical contact pads of an auxiliary circuit board, said apparatus comprising a support element, a plurality of signal wires coupled to said support element, a plurality of conductive bumps coupled to said signal wires, arranged on said support element for providing electrical contact between said signal wires and said electrical contact pads on said motherboard and for providing electrical contact between said signal wires and said electrical contact pads on said auxiliary circuit board, a plurality of alignment posts and holes in said support element for aligning said electrical contact pads on said motherboard and said auxiliary circuit board with said plurality of conductive bumps, and alignment circuitry for indicating whether said support element is properly aligned with said motherboard.

10. The apparatus in claim 9 where said contact pads are arranged in a first pattern and said conductive bumps are in locations that match said first pattern.

11. The apparatus in claim 9 where said plurality of alignment holes comprise a set of four holes for aligning said support element with said motherboard and for aligning said support element with said auxiliary circuit board, wherein screws may be inserted through said alignment holes to fasten said support element to said motherboard and auxiliary circuit board.

12. The apparatus in claim 9 where said alignment circuitry comprises two alignment bumps positioned at opposite ends of the support element such that said alignment bumps are in contact with two alignment pads on said motherboard when said conductive bumps on said support element are in electrical contact with said electrical contact pads on said motherboard, where when contact is made between said alignment bumps and said alignment pads an indicator is activated.

13. A computer system comprising:

microprocessing means for processing digital data;

memory means for storing said digital data;

bus means for coupling said processing means to said memory means;

means for electrically connecting electrical contact pads of the motherboard to electrical contact pads of an auxiliary circuit board, said means comprising support means for providing a structural framework for said apparatus, transmission means coupled to said support means for sending an electrical signal from one location to another, conduction means coupled to signal wires, arranged on said support means for providing electrical contact between said signal wires and said electrical contact pads on said motherboard and for providing electrical contact between said signal wires and said electrical contact pads on said auxiliary circuit board, alignment means in said support means for aligning electrical contact pads on said motherboard and said auxiliary circuit board with a plurality of conductive bumps and indication means for indicating whether said support means is properly aligned with said motherboard.

14. The apparatus in claim 13 where said contact pads are arranged in a first pattern and said conduction means are in locations that match said first pattern.

15. The computer system in claim 13 where said alignment means include four holes for aligning said support means with said motherboard and for aligning said support means with said auxiliary circuit board, wherein screws may be inserted through said holes to fasten said support means to said motherboard and said auxiliary circuit board.

16. The apparatus in claim 13 where said indication means comprises two alignment bumps positioned at opposite ends of said support means such that said alignment bumps are in contact with two alignment pads on said motherboard when said conduction means on said support means are in electrical contact with said electrical contact pads on said motherboard, where when contact is made between said alignment bumps and said alignment pads an indicator is activated.

17. An apparatus for electrically connecting electrical contact pads on a first circuit board to electrical contact pads on a second circuit board, wherein said first circuit board has a first plurality of holes and said second circuit board has a second plurality of holes, the apparatus comprising:

a support element having a first side and a second side;

a plurality of signal wires coupled to said support element, said signal wires having first ends and second ends, where said first ends are at said first side of said support element and said second ends are at said second side of said support element;

a plurality of conductive bumps coupled to said first and second ends of said signal wires, said conductive bumps are arranged on said first and second side of said support element such that when said support element is properly aligned between said first and second circuit boards, there is electrical contact between said conductive bumps on said first side of said support element and said electrical contact pads on said first circuit board and said conductive bumps on said second side of said support element and said electrical contact pads on said second circuit board;

a plurality of alignment posts and holes in said support element for aligning said first plurality of holes in said first circuit board and said second plurality of holes in said second circuit board with said support element;

alignment circuitry for indicating whether said support element is properly aligned with said first circuit board.

18. The apparatus in claim 17 where said contact pads are arranged in a first pattern and said conductive bumps are in locations that match said first pattern.

19. The apparatus in claim 17 where said plurality of alignment holes comprise a set of four holes for aligning said support element with said first circuit board and for aligning said support element with said second circuit board, wherein screws may be inserted through said alignment holes to fasten said support element to said first and second circuit boards.

20. The apparatus in claim 17 where said alignment circuitry comprises two alignment bumps positioned at opposite ends of said first side of said support element such that said alignment bumps are in contact with two alignment pads on said first circuit board when said conductive bumps on said first side of said support element are in electrical contact with said electrical contact pads on said first circuit board, where when contact is made between said alignment bumps and said alignment pads an indicator is activated.

* * * * *